United States Patent
Wu et al.

(10) Patent No.: US 10,665,296 B1
(45) Date of Patent: May 26, 2020

(54) MEMORY DRIVING DEVICE

(71) Applicants: Jiangsu Advanced Memory Technology Co., Ltd., Jiangsu (CN); ALTO MEMORY TECHNOLOGY CORPORATION, Hsinchu County (TW)

(72) Inventors: Jui-Jen Wu, Hsinchu County (TW); Fan-Yi Jien, Hsinchu County (TW)

(73) Assignees: Jiangsu Advanced Memory Technology Co., Ltd., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/364,166

(22) Filed: Mar. 25, 2019

(30) Foreign Application Priority Data

Dec. 24, 2018 (CN) .......................... 2018 1 1583944

(51) Int. Cl.
G11C 13/00 (2006.01)
G11C 11/56 (2006.01)
G11C 16/26 (2006.01)
G11C 5/14 (2006.01)
G11C 7/12 (2006.01)

(52) U.S. Cl.
CPC ...... *G11C 13/0038* (2013.01); *G11C 11/5678* (2013.01); *G11C 13/0002* (2013.01); *G11C 13/0004* (2013.01); *G11C 13/004* (2013.01); *G11C 2013/0045* (2013.01); *G11C 2013/0052* (2013.01)

(58) Field of Classification Search
CPC ............ G11C 13/0038; G11C 13/0004; G11C 13/004; G11C 2013/0045; G11C 2013/0052; G11C 11/5678; G11C 13/0002
USPC .......... 365/148, 163, 189.11, 210.11, 210.12
See application file for complete search history.

(56) References Cited

U.S. PATENT DOCUMENTS

| 5,835,420 A | * | 11/1998 | Lee ........................ G11C 5/147 365/189.09 |
| 8,400,212 B1 | * | 3/2013 | Nguyen ................... H02M 3/07 327/536 |
| 9,202,561 B1 | * | 12/2015 | Park .................... G11C 13/0038 |
| 9,401,203 B1 | * | 7/2016 | Chang ................ G11C 13/0038 |
| 2005/0180188 A1 | * | 8/2005 | Bedeschi ................. G11C 7/12 365/145 |
| 2008/0043513 A1 | * | 2/2008 | Hoenigschmid ......... G11C 7/02 365/148 |

(Continued)

*Primary Examiner* — Ly D Pham
(74) *Attorney, Agent, or Firm* — CKC & Partners Co., LLC

(57) ABSTRACT

A memory driving device includes a first switch, a voltage detecting circuit, and a switch array. The first switch includes a first output terminal and a first control terminal, and the first output terminal provides an output voltage for a memory unit. The voltage detecting circuit is coupled to the first output terminal, and configured to detect the output voltage, and generates a control signal according to the output voltage, wherein the control signal changes in real time according to the changing of the output voltage. The switch array includes a plurality of second switches, and the second switches are coupled to the first control terminal. At least one of the second switches is turned on according to the control signal so as to adjust a voltage of the first control terminal for regulating a waveform of the output voltage.

11 Claims, 4 Drawing Sheets

(56) References Cited

U.S. PATENT DOCUMENTS

| | | | |
|---|---|---|---|
| 2011/0157957 A1* | 6/2011 | Kim | G11C 13/0004 |
| | | | 365/148 |
| 2015/0243352 A1* | 8/2015 | Park | G11C 11/5642 |
| | | | 365/163 |
| 2018/0108407 A1* | 4/2018 | Ham | G11C 5/147 |
| 2019/0115054 A1* | 4/2019 | Luo | G11C 13/0026 |

* cited by examiner

MEMORY DRIVING DEVICE

This application claims priority to China Application Serial Number 201811583944.0, filed Dec. 24, 2018, which is herein incorporated by reference.

BACKGROUND OF THE INVENTION

Field of Invention

The present invention relates to a memory. More particularly, the present invention relates to a memory driving device.

Description of Related Art

In conventional memory technology, Dynamic Random-Access Memories (DRAM) and Static Random-Access Memories (SRAM), for example, are fully developed; however, the chip size shrinkage is facing the physical limitation. Hence, it is an important topic to develop a new memory technology to meet the requirement of memory application in the near future.

In memory technology, a resistive random-access memory includes a phase change memory (PCM), which can change its resistance value by changing the crystal phase itself, so as to store information. When the material in the memory element is crystalline, it exhibits low resistance, and conversely, when the material in the memory element is amorphous, it exhibits high resistance, thereby data, such as "1" or "0", being stored in the memory element.

For example, resistive random-access memories will be driven by corresponding voltage/current to execute operations of setting or resetting. However, the property of every resistive random-access memory is different. Conventional memory driving circuits cannot adaptively adjust its driving voltage/current based on each of resistive random-access memories. For example, the resistance of each of resistive random-access memories is related to the current waveform written into itself. For adaptively regulating the resistance of every resistive random-access memory, there will be a mechanism to adaptively adjust the current waveform which is written into the resistive random-access memory. Hence, it is an important research topic and a demanding target to design a memory driving circuit, which is able to adjust driving voltage/current based on the property of each of resistive random-access memories.

SUMMARY OF THE INVENTION

The following presents a brief summary of the disclosure in order to provide a basic understanding to the reader. This summary is not an extensive overview of the disclosure and it does not identify the key or critical elements of the present invention or delineate the scope of the present invention.

One aspect of the present disclosure is directed to a memory driving device which includes a first switch, a voltage detecting circuit, and a switch array. The first switch includes a first output terminal and a first control terminal; the first output terminal provides an output voltage for a memory unit. The voltage detecting circuit is coupled to the first output terminal and configured to detect the output voltage, and generate a control signal according to the output voltage, wherein the control signal changes in real time based on the changing of the output voltage. The switch array includes a plurality of second switches, and the second switches are coupled to the first control terminal. At least one of the second switches is turned on according to the control signal so as to adjust the voltage of the first control terminal for regulating the waveform of the output voltage.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

Figure 1:
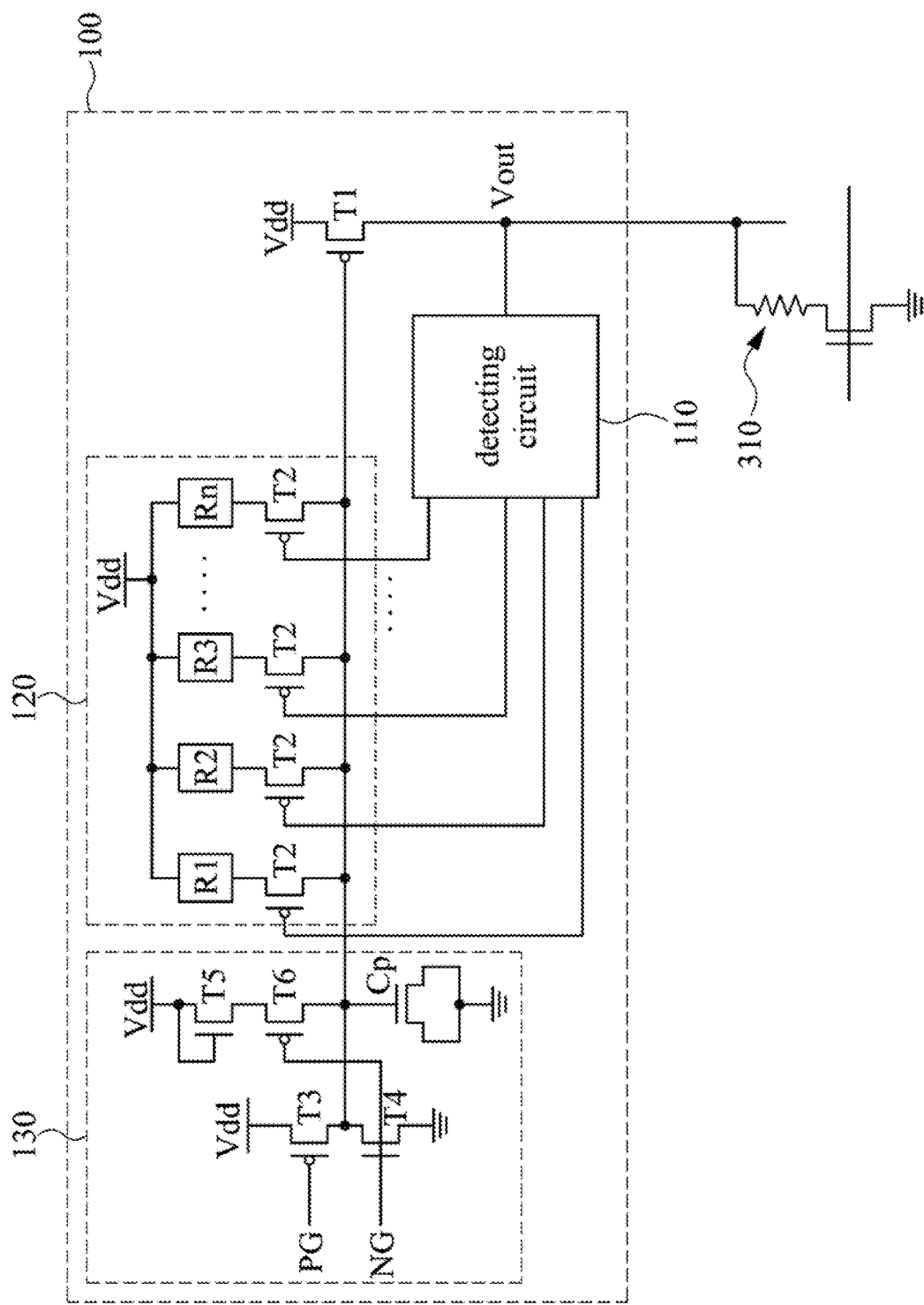
FIG. 1 is a circuit block diagram of a memory according to some embodiments of the present disclosure.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure have the meanings that are commonly understood and used by one of ordinary skill in the art. Unless otherwise required by context, it will be understood that singular terms shall include plural forms of the same and plural terms shall include singular forms of the same.

FIG. 1 is a circuit block diagram of a memory according to some embodiments of the present disclosure. As shown in the figure, a memory includes a memory driving device 100 and a memory unit 310.

Referring to FIG. 1, the memory driving device 100 includes a switch T1, a voltage detecting circuit 110, a switch array 120, and a voltage setting circuit 130. The switch array 120 includes a plurality of switches T2. With respect to connection, the switch T1 is coupled to the memory unit 310. The voltage detecting circuit 110 is coupled to one terminal of the switch T1. The switch array 120 is coupled to the voltage detecting circuit 110. The voltage setting circuit 130 is coupled to the switch array 120. The switches T2 are coupled to a control terminal of the switch T1.

With respect to operation, the switch T1 is configured to provide an output voltage Vout to the memory unit 310. The voltage detecting circuit 110 is configured to detect the output voltage Vout and generates a control signal according to the output voltage Vout. At least one of the switches T2 is turned on according to the control signal so as to adjust the voltage of the control terminal of the switch T1 for regulating the waveform of the output voltage Vout. Therefore, the memory driving device 100 of the present disclosure can detect the output voltage Vout of the switch T1 immediately and determine how to turn on the switches T2 of the switch array 120 according the detecting result; for example, how many switches T2 should be turned on, or which one of the switches T2 should be turned on, so as to adjust the voltage of the control terminal of the switch T1 for regulating the waveform of the output voltage Vout.

In one embodiment, the switch T1 is a PMOS element. In a voltage output period, a switch T3 of the voltage setting circuit 130 receives an input signal PG with high level, a switch T4 receives an input signal NG with high level. At this time, the voltage of the control terminal of the switch T1 is a low voltage near the ground. Hence, the switch T1 is fully turned on, and a voltage near the Vdd level is outputted continuously. In a voltage decreasing period, the switch T3 of the voltage setting circuit 130 receives the input signal PG with high level, and the switch T4 receives the input signal NG with low level. At this time, the switches T3, T4 are turned off, and the switches T5, T6 are turned on. The current flowing through the switches T5, T6 charges a capacitor Cp gradually so as to progressively increase the voltage of the control terminal of the switch T1. Under such circumstance, the switch T1 is turned off gradually, and thereby the voltage of the output terminal Vout gradually decreases. At this stage, the switch array 120 and the voltage detecting circuit 110 can further be used to adjust a rising waveform of the voltage of the control terminal of the switch T1 so as to adjust the waveform of the output voltage Vout.

With respect to connection, the switches T2 in the switch array 120 are coupled to each other in parallel. The first terminal of every switch T2 is configured to receive power providing voltage Vdd, and the second terminal of every switch T2 is coupled to the control terminal of the switch T1.

Based on the above-mentioned structure, if the width/length (W/L) ratio of each of the switches T2 is the same, the switch array 120 turns on N switches of the switches T2 according to the control signal so as to adjust the voltage of the control terminal of the switch T1 for regulating the waveform of the output voltage Vout. N is a positive integer, and the value of N varies according to the change of the control signal. In one embodiment, the voltage detecting circuit 110 has a look-up table, and the look-up table can be stored in a memory (not shown) inside the voltage detecting circuit 110. Hence, the voltage detecting circuit 110 may obtain the corresponding number regarding the switches T2 in the look-up table according to the output voltage Vout so as to generate the control signal.

The control signal will be transmitted to the switch array 120 so as to turn on the corresponding number of the switches T2 for regulating the voltage of the control terminal of the switch T1 to adjust the waveform of the output voltage Vout. For example, reference is now made to FIG. 2, which is the output voltage waveform Vout of the memory driving device 100 as illustrated in FIG. 1 according to some embodiments of the present disclosure. The output voltage waveform Vout can be adjusted to be the waveforms C1, C2, C3, C4, etc. according to design or actual requirements. The waveform C2 is used as an example herein. At period C21, the switches T2 of the switch array 120 are all turned off, and the waveform C2 is therefore maintained at the same level. At period C22, ten switches T2 of the switch array 120 are turned on, so that the waveform C2 drops rapidly. At period C23, five switches T2 of the switch array 120 are turned on, so that the waveform C2 decreases slowly. As a result, the waveform of the output voltage Vout can be adjusted by controlling the number of the turned-on switches T2 within the switch array 120.

In another embodiment, the switches T2 of the switch array 120 are coupled to each other in parallel. In this situation, if the W/L ratio of each of the switches T2 is different, the currents provided by the switches T2 will be different. At this time, the switch array 120 turns on at least one corresponding switch T2 according to the control signal so as to adjust the voltage of the control terminal of the switch T1 for regulating the waveform of the output voltage Vout. In one embodiment, the voltage detecting circuit 110 has a look-up table, and the voltage detecting circuit 110 may obtain the corresponding switches T2 of the switch array 120 in the look-up table according to the output voltage Vout so as to generate the control signal.

The control signal will be transmitted to the switch array 120 so as to turn on the corresponding switch T2. The W/L ratios of the switches T2 are different, so the currents provided by the switches T2 will be different. Therefore, in different situations, the corresponding switch T2 will be turned on in order to adjust the voltage of the control terminal of the switch T1 for regulating the waveform of the output voltage Vout. For example, referring to FIG. 2, the waveform of the output voltage Vout can be adjusted to be the waveforms C1, C2, C3, C4, etc. according to design or actual requirements. The waveform C2 is used as an example herein. At period C21, the switches T2 of the switch array 120 are all turned off, and the waveform C2 is therefore maintained at a level near Vdd. At period C22, the switch T2 which provides larger current in the switch array 120 is turned on, so that the waveform C2 drops rapidly. At period C23, the switch T2 which provides lower current in the switch array 120 is turned on, so that the waveform C2 decreases slowly. As a result, the waveform of the output voltage Vout can be adjusted by controlling the corresponding switch T2 of the switch array 120.

In one embodiment, the first terminal of every switch T2 is coupled to the loading R1~Rn, and receives the power providing voltage Vdd through the loading R1~Rn. In another embodiment, the equivalent resistant value of each of the loadings R1-Rn, which is coupled to each of the switches T2, is different, and the switch array 120 turns on at least one corresponding switch of the switches T2 according to the control signal so as to adjust voltage of the first control terminal of the switch T1 for regulating the waveform of the output voltage. It is noted that elements marked as R1~Rn in the switch array 120 of FIG. 1 are used as loadings. The loadings R1~Rn can be formed by resistors, transistors, diodes, or other semiconductor elements. Values of the loading resistors R1~Rn can be the same, or the values of the loading resistors R1~Rn can be designed in ascending order, or the values of the loading resistors R1~Rn can be designed in descending order. Owing to the loading resistors R1~Rn can be designed with different values, in the situation that the switches T2 are the same, the corresponding switch T2 can be turned on to charge the capacitor Cp, so that the voltage of the control terminal of the switch T1 exhibits different waveforms or slopes, which in turn generates different waveforms or slopes of the output voltage Vout.

Figure 3:
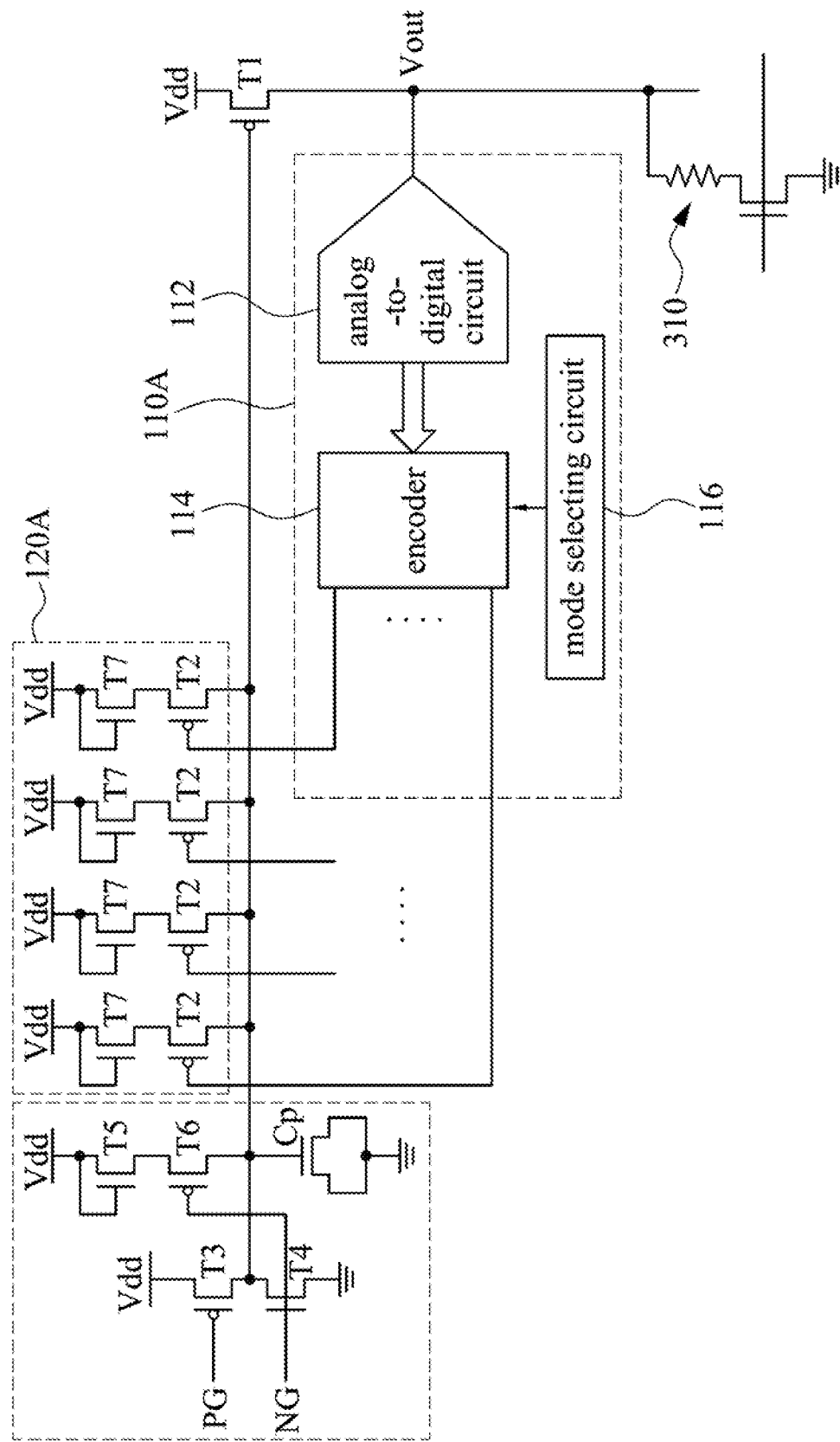
FIG. 3 is a circuit block diagram of a memory according to some embodiments of the present disclosure.

FIG. 3 is a circuit block diagram of a memory according to some embodiments of the present disclosure. It is noted that this embodiment provides an implementation for the voltage detecting circuit 110 and the switch array 120 as shown in FIG. 1; however, the present disclosure is not limited thereto. Referring to FIG. 3, the voltage detecting circuit 110A includes an analog-to-digital circuit 112, an encoder 114, and a mode selecting circuit 116. The switch array 120A includes a plurality of switches T2 and switches T7. In one embodiment, a drain terminal of the switch T7 is coupled to a gate terminal of the switch T7, and the above-mentioned structure is used as a resistor; however, the present disclosure is not limited thereto, other suitable element can also be used as the resistor.

With respect to connection, the analog-to-digital circuit 112 is coupled to one terminal of the switch T1. The encoder 114 is coupled to the analog-to-digital circuit 112. The mode selecting circuit 116 is coupled to the encoder 114. The switch array 120A is coupled to the encoder 114.

With respect to operation, the analog-to-digital circuit 112 transforms the output voltage Vout from an analog output voltage signal into a digital output voltage signal. The encoder 114 generates the control signal according to the digital output voltage signal.

The control signal generated by the encoder 114 will be transmitted to the switch array 120A so as to turn on the corresponding number of the switches T2, so that the voltage of the control terminal of the switch T1 can be adjusted for regulating the waveform of the output voltage Vout. For example, referring to FIG. 2, if the W/L ratios of the switches T2 are the same, the switch array 120 turns on N switches of the switches T2 according to the control signal so as to adjust the voltage of the control terminal of the switch T1 for regulating the waveform of the output voltage Vout. The output voltage waveform Vout can be adjusted to be the waveforms C1, C2, C3, C4, etc. according to design or actual requirements. The waveform C2 is used as an example herein. At period C21, the switches T2 of the switch array 120 are all turned off, and the waveform C2 is therefore maintained at a level which is near Vdd. At period C22, ten switches T2 of the switch array 120 are turned on, so that the waveform C2 drops rapidly. At period C23, five switches T2 of the switch array 120 are turned on, so that the waveform C2 decreases slowly. As a result, the wave form of the output voltage Vout can be adjusted by controlling the turned on number of the switches T2 of the switch array 120.

In another embodiment, the control signal generated by the encoder 114 will be transmitted to the switch array 120A so as to turn on corresponding switches T2. Since the W/L ratio of each of switches T2 is different, the current provided by each switch T2 is also different. Therefore, in different situations, the corresponding switch T2 should be turned on so as to adjust the voltage of the control terminal of the switch T1 for regulating the waveform of the output voltage Vout. For example, referring to FIG. 2, the output voltage waveform Vout can be adjusted to be the waveforms C1, C2, C3, C4, etc. according to design or actual requirements. The waveform C2 is used as an example herein. At period C21, all the switches T2 in the switch array 120 are turned off, and the waveform C2 is therefore maintained at a level near Vdd. At period C22, the switch T2, which provides larger current in the switch array 120, is turned on, so that the wave form C2 drops rapidly. At period C23, the switch T2, which provides lower current in the switch array 120, is turned on, so that the wave form C2 decreases slowly. As a result, the waveform of the output voltage Vout can be adjusted by controlling corresponding switches T2 of the switch array 120.

Figure 2:
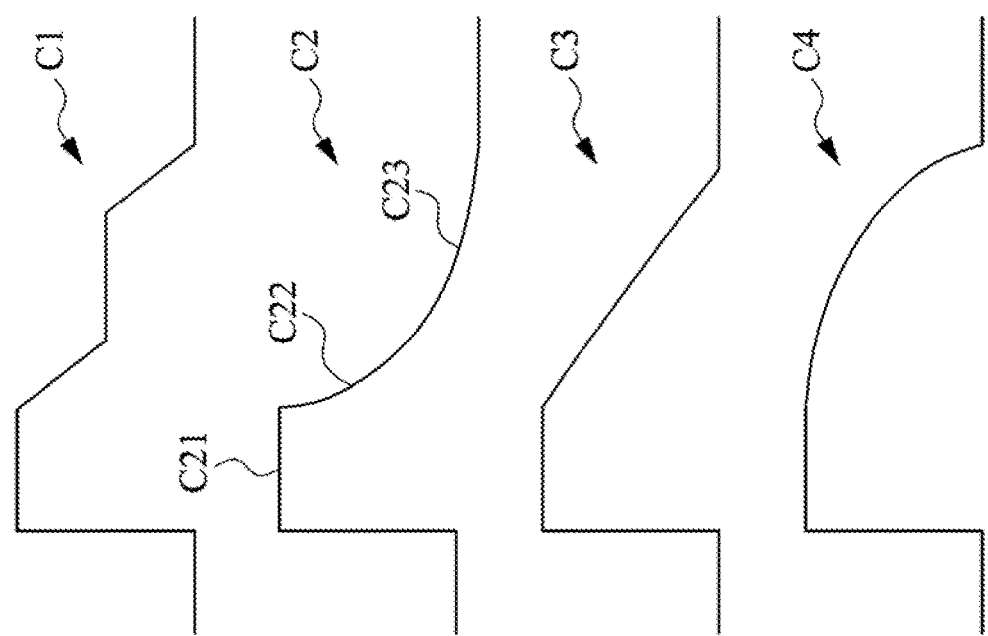
FIG. 2 is an output voltage diagram of the memory driving device as illustrated in FIG. 1 according to some embodiments of the present disclosure.

In another embodiment, the mode selecting circuit 116 is configured to receive and transmit an input command to the encoder 114. The encoder 114 then generates the control signal according to the input command. For example, referring to FIG. 2, if the output voltage Vout with the waveform C1 is needed, a user can enter the input command through the mode selecting circuit 116, and then the mode selecting circuit 116 transmits the input command to the encoder 114. When the encoder 114 receives the input command, the encoder 114 generates the control signal to control the switch circuit 120A according to the input command so as to produce the output voltage Vout with waveform C1. If the output voltage Vout with the waveforms C2~C4 is needed, a user can adopt the same means to enter the input command so as to generate the needed waveform. However, the present disclosure is not limited to the waveform as shown in FIG. 2. The embodiment herein is used as an example only, and other suitable waveforms can be generated by the above-mentioned technology.

Figure 4:
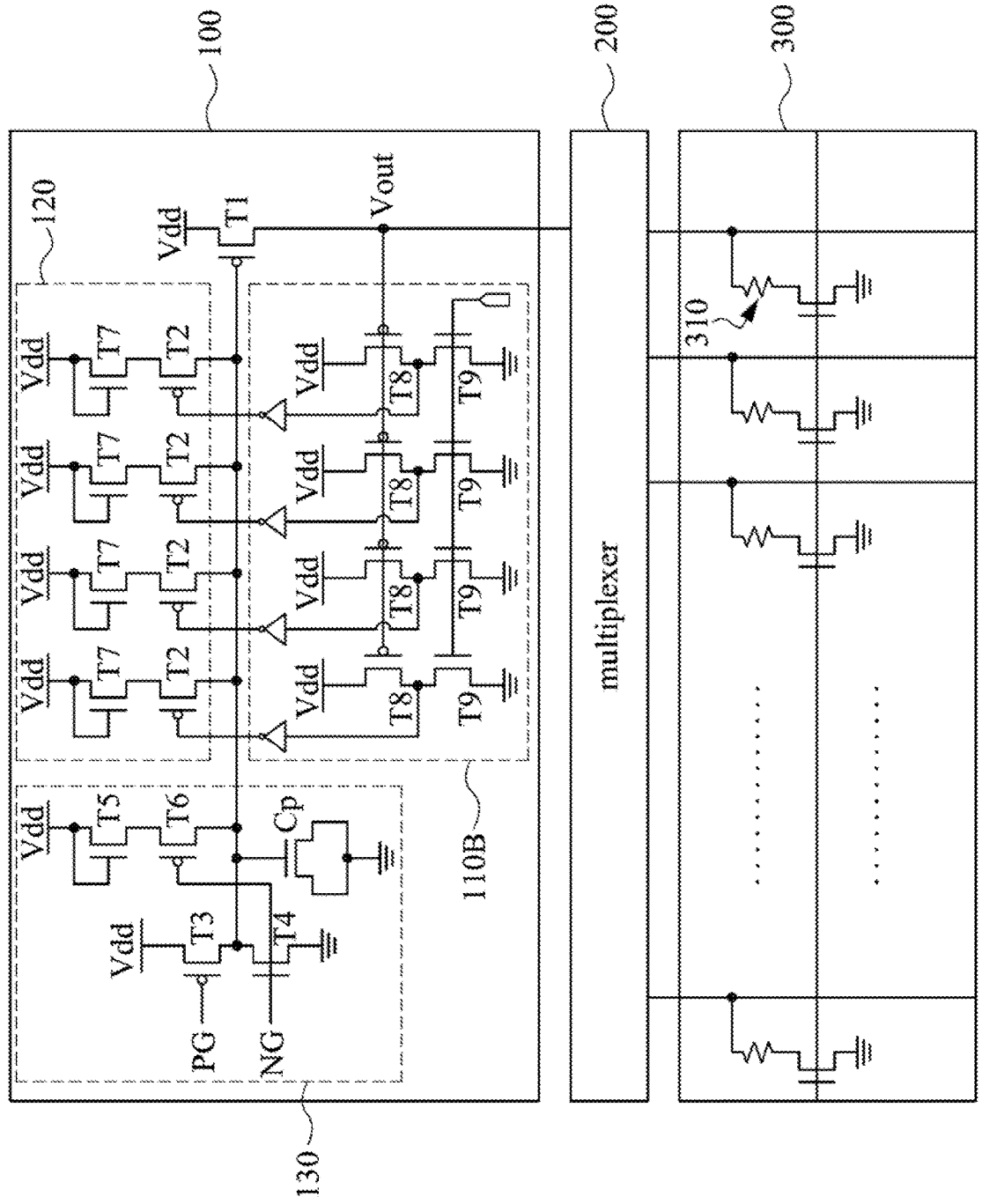
FIG. 4 is a circuit block diagram of a memory according to some embodiments of the present disclosure.

FIG. 4 is a circuit block diagram of a memory according to some embodiments of the present disclosure. As shown in the figure, a memory includes a memory driving device 100, a multiplexer 200, and a memory array 300. The memory driving device 100 is configured to drive the memory unit 310 of the memory array 300. The multiplexer 200 is used to choose the memory unit 310 to which the memory driving device 100 would drive currents. In the present disclosure, the voltage detecting circuit 110B works together with the switch array 120 to control the switch T1 for providing the output voltage Vout with different waveforms to the memory unit 310 within the memory array 300.

It is noted that the embodiment in FIG. 4 provides an implementation for the voltage detecting circuit 110 and the switch array 120 as shown in FIG. 1; however, the present disclosure is not limited thereto. Referring to FIG. 4, the voltage detecting circuit 110B includes a plurality of voltage detect units which are coupled to each other in parallel. The voltage detect unit can be composed of switches T8, T9. Referring to FIG. 4, there are 4 voltage detect units and 4 switches T2 in the voltage detecting circuit 110B; however, the present disclosure is not limited thereto. As can be seen in the figure, the number of the voltage detect units are equal to the switches T2 and corresponding to each other. Each of the voltage detect unites, which are coupled to each other in parallel, has a second output terminal and a second control terminal. Each of the second output terminals is coupled to the control terminal of the corresponding switch T2. The second control terminal of each of voltage detect units, coupled to each other in parallel, is coupled to the first output terminal of the switch T1. For example, each of voltage detect units includes switches T8, T9, and the switches T8, T9 are connected to each other in series. The series-connected point of the switches T8, T9 is the second output terminal of the voltage detect unit, and the series-connected point is coupled to the control terminal of the switch T2 through an inverter. In addition, the switch T8 is coupled to the voltage source Vdd and the second control terminal of the voltage detect unit; and the second control terminal is used to control the turn on or the turn off of the switch T8. The switch T9 is turned on and coupled to a ground terminal. In one embodiment, the characteristic of each of the switches T8 can be designed to be different to each other, so that the switches T8 can be sequentially turned on according to different output voltages Vout in order to turn on the switches T2 sequentially; and that would adjust the voltage of the control terminal of the switch T1 to regulate the waveform of the output voltage Vout. For example, the W/L ratios and/or the threshold voltage (Vth) of the switches T8 can be designed to be different. In the above-mention situation, the threshold voltages or the W/L ratios of the switches T8 can be designed to decrease from left to right, from right to left, or according to actual requirements to design properly. In addition, the voltage detecting circuit 110B in FIG. 4 can work together with the analog-to-digital circuit 112 and the encoder 114 in FIG. 3 so as to turn on corresponding switches T8, T9 for generating the needed waveform of the output voltage Vout.

It is noted that the present disclosure is not limited to the circuit as shown in FIG. 1~FIG. 4. The embodiments in FIG. 1~FIG. 4 are used as examples only. For example, switches T1~T9 in FIG. 1~FIG. 4 can be P-type or N-type Metal-Oxide-Semiconductor Field-Effect Transistor (MOSFET) based on actual requirements, or can be other proper type of switch. The memory units 310 in FIG. 1~FIG. 4 can be Phase change memory (PCM), or can be other proper type of memory based on actual requirements.

In view of the above embodiments of the present disclosure, it is apparent that the application of the present invention has the advantages as follows. The embodiment of the present disclosure provides a memory driving device. The memory driving device can detect the output voltage of switches immediately, and then determine to turn on the switches in the switch array based on the detected result, for example, how many switches should be turned on or which switch should be turned on so as to adjust voltage of the control terminal of the switch for regulating the waveform of the output voltage.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory driving device, comprising:
    a first switch having a first output terminal and a first control terminal, wherein the first output terminal provides an output voltage to a memory unit;
    a voltage detecting circuit coupled to the first output terminal, and configured to detect the output voltage and generate a control signal according to the output voltage, wherein the control signal is changed in real time according to a change of a value of the output voltage; and
    a switch array comprising a plurality of second switches, wherein the second switches are coupled to the first control terminal, wherein at least one of the second switches is turned on according to the control signal so as to adjust a voltage of the first control terminal for regulating a waveform of the output voltage,
    wherein each of the second switches has a first terminal and a second terminal, and the second switches are coupled to each other in parallel, and
    wherein the first terminal of each of the second switches is configured to receive a power supplying voltage, and the second terminal of each of the second switches is coupled to the first control terminal, and
    wherein the first terminal of each of the second switches is coupled to a loading and receives the power supplying voltage through the loading, wherein equivalent resistant values of each of the loadings, which is coupled to each of the second switches, are different, wherein the switch array turns on at least one corresponding second switch of the second switches according to the control signal so as to adjust voltage of the first control terminal for regulating the waveform of the output voltage.

2. The memory driving device of claim 1, wherein currents provided by the second switches are the same, wherein the switch array turns on N number of the second switches according to the control signal so as to adjust voltage of the first control terminal for regulating the waveform of the output voltage, wherein N is a positive integer, and a value of N is changed according to the control signal.

3. The memory driving device of claim 1, wherein currents provided by the second switches are different, wherein the switch array turns on at least one corresponding second switch of the second switches according to the control signal so as to adjust voltage of the first control terminal for regulating the waveform of the output voltage.

4. The memory driving device of claim 1, wherein the voltage detecting circuit comprises a look-up table, wherein the voltage detecting circuit looks into the look-up table to find the at least one corresponding second switch of the second switches according to the output voltage so as to generate the control signal.

5. The memory driving device of claim 1, wherein the voltage detecting circuit comprises:
    an analog-to-digital circuit configured to transmit the output voltage from an analog output voltage signal into a digital output voltage signal; and
    an encoder configured to generate the control signal according to the digital output voltage signal.

6. The memory driving device of claim 5, wherein the voltage detecting circuit further comprises:
    a mode selecting circuit coupled to the encoder, and configured to receive and transmit an input command to the encoder, wherein the encoder generates the control signal according to the input command.

7. The memory driving device of claim 1, wherein the voltage detecting circuit comprises a plurality of voltage detect units which are coupled to each other in parallel, wherein a number of the voltage detect units is same as the second switches, each of the voltage detect units corresponds to each of the second switches one by one, each of the voltage detect units coupled to each other in parallel has a second output terminal and a second control terminal, each of the second output terminals is coupled to a control terminal of the second switch correspondingly, and the second control terminal of each of the voltage detect units which is coupled to each other in parallel is coupled to the first output terminal together.

8. The memory driving device of claim 7, wherein each of the voltage detect units comprises a fourth switch and a fifth switch, and the fourth switch and the fifth switch are connected to each other at a series-connected point in series, wherein the series-connected point is the second output terminal, and the fourth switch is coupled to a voltage source and the second control terminal, wherein the second control terminal is configured to turn on or turn off the fourth switch, and the fifth switch is turned on and coupled to a ground terminal.

9. The memory driving device of claim 8, wherein width/length (W/L) ratios of the fourth switches are different.

10. The memory driving device of claim 8, wherein values of turn on voltages of the fourth switches are different.

11. The memory driving device of claim 8, wherein width/length (W/L) ratios of the fifth switches are different.

\* \* \* \* \*